United States Patent
Liu et al.

[11] Patent Number: 6,064,704
[45] Date of Patent: May 16, 2000

[54] DIGITAL PULSE FILTERING CIRCUIT

[75] Inventors: Don Liu, Yung-Kang; Neil Tai, Hsinchu, both of Taiwan

[73] Assignee: United Microelectronics Corp., Hsinchu, Taiwan

[21] Appl. No.: 08/927,070

[22] Filed: Sep. 10, 1997

[30] Foreign Application Priority Data

Apr. 19, 1997 [TW] Taiwan ................................. 86206151

[51] Int. Cl.[7] .............................. H04B 1/10; H03D 1/04; G01R 29/02
[52] U.S. Cl. .............................. 375/350; 375/346; 327/33
[58] Field of Search ................................ 375/350, 316, 375/346, 371, 355; 327/33, 31, 36, 298; 324/103

[56] References Cited

U.S. PATENT DOCUMENTS

| | | | |
|---|---|---|---|
| 4,843,307 | 6/1989 | Ichijyo | 324/103 |
| 5,243,630 | 9/1993 | Rhebergen | 375/355 |
| 5,452,333 | 9/1995 | Guo et al. | 375/371 |
| 5,457,718 | 10/1995 | Anderson et al. | 375/373 |
| 5,666,387 | 9/1997 | Tamamura et al. | 375/371 |
| 5,726,593 | 3/1998 | Ruuskanen | 327/99 |

OTHER PUBLICATIONS

Amin R. Ismail et al "Digital Concepts and Applications" Sauders College Publishing—pp. 286–288, 1994.

*Primary Examiner*—Chi H. Pham
*Assistant Examiner*—Khai Tran
*Attorney, Agent, or Firm*—Rabin & Champagne, P.C.

[57] ABSTRACT

A digital pulse filtering circuit for filtering out pulses of specific pulse widths in a composite signal is provided. The digital pulse filtering circuit includes a sampling circuit for sampling the input composite signal based on a periodic clock signal to thereby generate a plurality of sampled signals of the input composite signal. In response to these sampled signals, a detection circuit outputs a low-frequency composite signal which is a filtered version of the input composite signal. The digital pulse filtering circuit is completely based on digital circuitry which can be built in integrated circuits. The cutoff frequency of the digital pulse filtering circuit is dependent on the frequency of the clock signal, which is very easy and accurate to adjust.

9 Claims, 3 Drawing Sheets

DIGITAL PULSE FILTERING CIRCUIT

BACKGROUND OF THE INVENTION

1. Field of the Invention

This invention relates to filtering circuits, and more particularly, to a digital pulse filtering circuit which can filter out pulses of specific widths in a composite signal and which is constructed completely based on digital circuitry.

2. Description of Related Art

In conventional monitors, a composite signal comprises all the sync signals necessary for proper operation of the monitors. These sync signals include a vertical sync signal and a horizontal sync signal. The composite signal can be either positive or negative in polarity. In practice, the horizontal sync signal is a first periodic pulse train having a period of from 8.33 μs (microsecond) to 33.33 μs and a pulse width of from 1.0 μs to 3.92 μs; while the vertical sync signal is a second periodic pulse train having a period of from 8.33 ms (millisecond) to 25 ms and a pulse width from 0.0384 ms to 0.125 ms.

Given a composite signal, the vertical sync component can be obtained by filtering out all the pulses in the composite signal that have a pulse width less than that of the horizontal sync signal. Further, the polarity of the composite signal can be determined by filtering out all the pulses in the foregoing obtained vertical sync signal that have a pulse width less than that of the vertical sync signal itself; the output of this filtering process is a DC signal with a positive or negative level that indicates the polarity of the composite signal.

Conventionally, the two above-mentioned filtering processes are achieved by passing the composite signal through analog filters that are constructed with resistors and capacitors. One drawback to these analog filters is that their constituent resistors and capacitors take up quite a large space on the circuit boards. Moreover, when the pulses that are to be filtered out are very large in pulse width, the analog filters require the use of large-resistance resistors and large-capacitance capacitors to implement, which take up an even larger space on the circuit boards and also cause the manufacturing cost to increase. Further, when the horizontal and vertical sync signals in the composite signal are close in frequency, the filtering effect will be less accurate due to the inability of the resistors and capacitors to provide an accurate bandwidth for the filters and due to drift in the characteristics of these components in the fabrication process.

SUMMARY OF THE INVENTION

It is therefore a primary objective of the present invention to provide a digital pulse filtering circuit which is based on digital circuitry for filtering out pulses of specific pulse widths in a composite signal.

It is another objective of the present invention to provide a digital pulse filtering circuit which can be adaptively adjusted in bandwidth when the pulse width of the vertical/horizontal sync signals in the composite signal is changed.

In accordance with the foregoing and other objectives of the present invention, a digital pulse filtering circuit for the filtering of composite signals is provided. This digital pulse filtering circuit can be used on computer monitor circuitry for separating two pulse signals either positive or negative in polarity with close frequencies, or on I²C data buses.

The digital pulse filtering circuit of the invention, in particular, is used to filter out all pulses in a composite signal that have a pulse width less than a preset value. Broadly speaking, the digital pulse filtering circuit includes:

a sampling circuit for sampling the input composite signal based on a periodic clock signal having a preset period to thereby generate a plurality of sampled signals of the composite signal; and a detection circuit, receiving the sampled signals, for generating an output signal which is a filtered version of the input composite signal, in such a manner that, when the sampled signals are all equal in logic voltage state, the output of said detection circuit is changed to the present state of these sampled signals; and otherwise, the current state of the output of said detection circuit remains unchanged.

Equivalently, this digital pulse filtering circuit acts as a low-pass filter with a cutoff frequency dependent on the frequency of the clock signal. One advantage of the digital pulse filtering circuit of the invention is that it is completely based on digital circuitry which can be built in integrated circuits. The manufacturing cost is thus very low. Moreover, the cutoff frequency of the digital pulse filtering circuit is dependent only on the frequency of the clock signal, which is very accurate and easy to adjust.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

Figure 1:
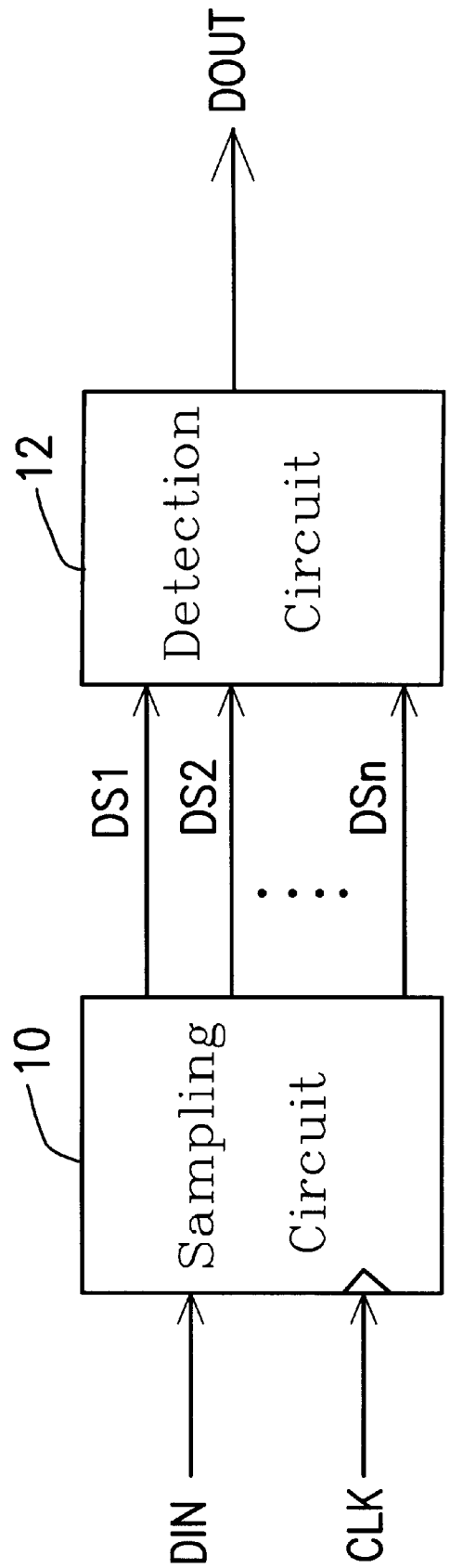
FIG. 1 is a schematic block diagram of the digital pulse filtering circuit according to the invention.
Figure 2:
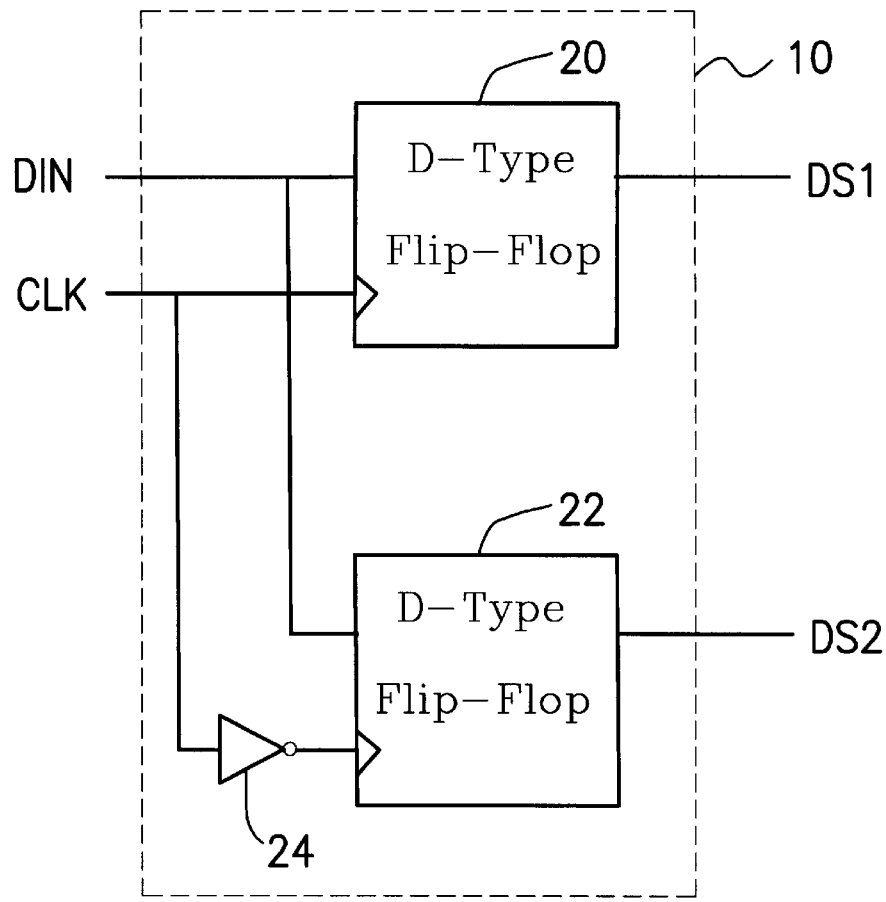
FIG. 2 is a schematic circuit diagram showing a more detailed structure of a sampling circuit used in the digital pulse filtering circuit of FIG. 1.
Figure 3:
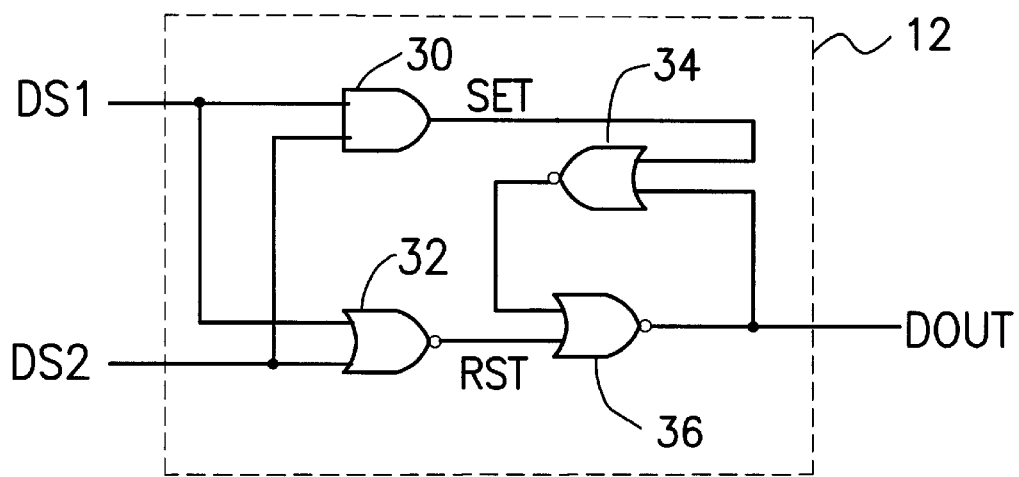
FIG. 3 is a schematic circuit diagram showing a more detailed structure of a detection circuit used in the digital pulse filtering circuit of FIG. 1.

FIG. 1 is a schematic block diagram of the digital pulse filtering circuit according to the invention. As shown, the digital pulse filtering circuit of the invention includes a sampling circuit 10 and a detection circuit 12. The sampling circuit 10 is used to sample an input composite signal DIN under control by a clock signal CLK to thereby generate a number of sampled signals DS1, DS2, ..., DSn of the input composite signal DIN. In response to these signals DS1, DS2, ..., DSn, the detection circuit 12 generates a low-frequency composite signal DOUT which is a low-pass filtered version of the input composite signal DIN. First, the detection circuit 12 checks these signals DS1, DS2, ..., DSn to see if they are all equal in logic value (voltage state); if YES, the current state of the low-frequency composite signal DOUT will be changed to the present state of these signals DS1, DS2, ..., DSn; and otherwise, the current state of the low-frequency composite signal DOUT will remain the same. Detailed structure and function of the sampling circuit 10 and detection circuit 12 will be illustrated and described in full detail in the following with reference to FIGS. 2 and 3. In the case of FIGS. 2 and 3, n=2.

Referring to FIG. 2, in a preferred embodiment of the invention, the sampling circuit 10 includes a pair of D-type flip flops 20, 22, and an inverter 24. The two D-type flip-flops 20, 22 are clocked by the clock signal CLK in such a manner that the first D-type flip-flop 20 is directly clocked by CLK, while the second D-type flip-flop 22 is clocked by an inverted version of the clock signal CLK that is inverted by the inverter 24. The input composite signal DIN is connected to the input of both of the two D-type flip-flops 20, 24. At the appearance of each rising edge in the clock signal CLK, the first D-type flip-flop 20 outputs a first sampled signal DS1 of the input composite signal DIN (i.e., the voltage state of the first sampled signal DS1 at this time is the current voltage state ofthe input composite signal DIN) while at the appearance of each rising edge in the inverted version of the clock signal CLK at the output of the inverter 430, the second D-type flip-flop 22 outputs a second sampled signal DS2 of the input composite signal DIN. Equivalently, the second sampled signal DS2 is a sampled signal of the input composite signal DIN at each falling edge in the clock signal CLK.

Referring to FIG. 3, the detection circuit 12 includes a NAND gate 30, a first NOR gate 32, a second NOR gate 34, and a third NOR gate 36. The detection circuit 12 outputs the low-frequency composite signal DOUT in response to DS1, DS2 from the sampling circuit 10 in accordance with the following truth table given in Table 1:

TABLE 1

| DS1 | DS2 | DOUT |
| --- | --- | --- |
| 1 | 1 | 1 |
| 1 | 0 | unchanged |
| 0 | 1 | unchanged |
| 0 | 0 | 0 |

The NAND gate 30 receives DS1 and DS2 and outputs a binary signal SET representing the NAND operation on the current logic states of DS1 and DS2; while the first NOR gate 32 outputs a binary signal RST (reset) representing the NOR operation on the same. The second NOR gate 34 takes the SET signal and the output ofthe detection circuit 12 (i.e., the low-frequency composite signal DOUT) as input and performs a NOR operation on these two inputs. The output of the second NOR gate 34 and the RST signal from the first NOR gate 32 are taken as inputs by the third NOR gate 36 to thereby generate the low-frequency composite signal DOUT.

It can be learned from Table 1 that the low-frequency composite signal DOUT will be changed in its logic voltage state only when the first sampled signal DS1 from the first D-type flip flop 20 is equal in voltage state to the second sampled signal DS2 from the second D-type flip flop 22. Otherwise, the voltage state of the low-frequency composite signal DOUT will remain the same.

For instance, when DS1 and DS2 are both at a HIGH voltage level, it will cause the SET signal to be at a HIGH voltage level and the RST signal at a LOW voltage level. As a result, the low-frequency composite signal DOUTis at a HIGH voltage level. On the other hand, when DS1 and DS2 are both at a LOW voltage level, it will cause the SET signal to be at a LOW voltage level and the RST signal at a HIGH voltage level. As a result, the low-frequency composite signal DOUT is at a LOW voltage level. Further, when one of DS1 and DS2 is at a HIGH voltage level while the other is at a LOW voltage level, the low-frequency composite signal DOUT will be unchanged and remain at its current voltage level. With this digital pulse filtering circuit, all pulses in the input composite signal DIN that have a pulse width less than half of the period of the clock signal CLK will be filtered out. Equivalently, this digital pulse filtering circuit acts as a low-pass filter with a cutoff frequency dependent on the frequency of the clock signal CLK.

Figure 4:
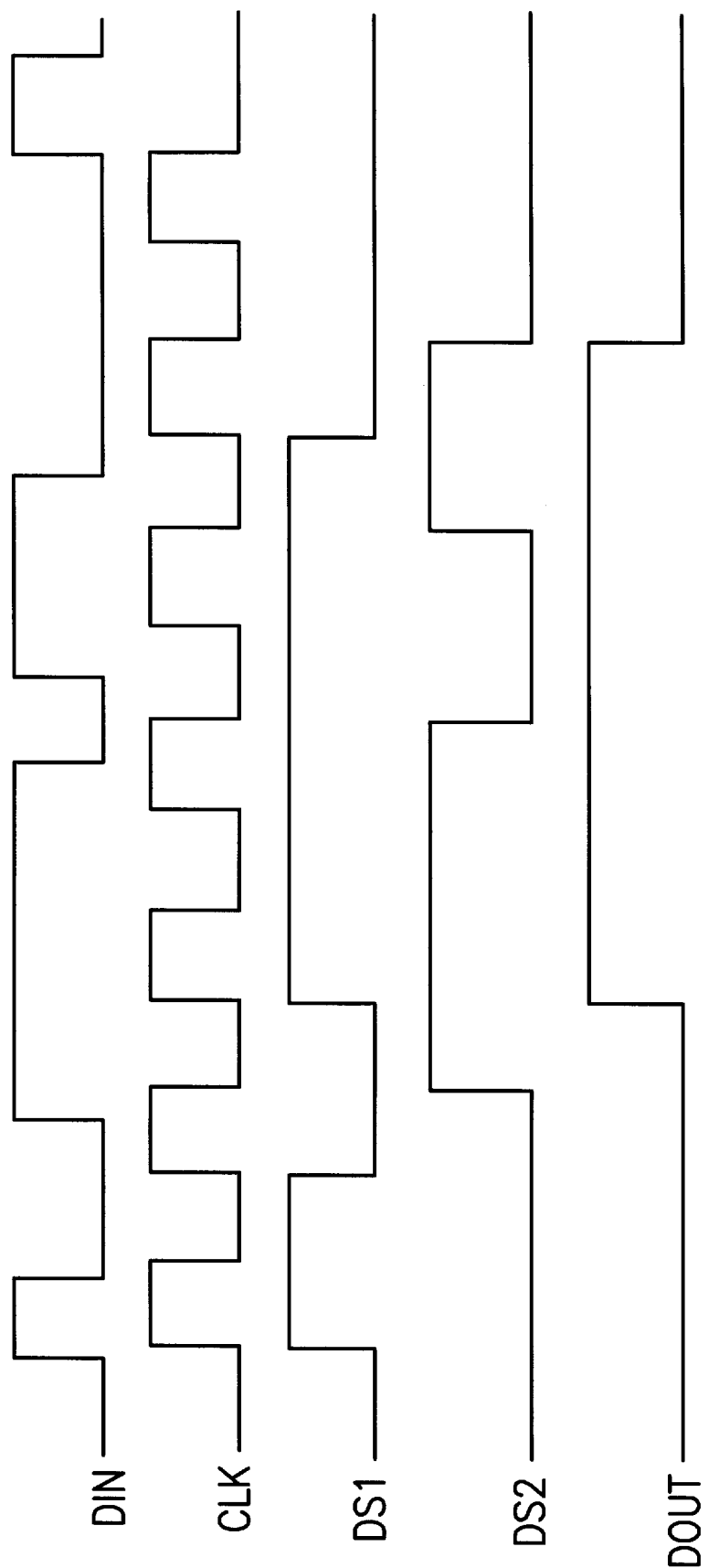
FIG. 4 is a waveform diagram of various signals in the digital pulse filtering circuit of FIG. 1.

FIG. 4 is a waveform diagram showing an example of the output low-frequency composite signal DOUT in response to an input composite signal DIN and a clock signal CLK.

As shown, at the appearance of the first rising edge in CLK, the first sampled signal DS1 takes on the current voltage level of the input composite signal DIN (a HIGH voltage level in the case of FIG. 4) and remains at this level until the appearance of the next rising edge in CLK. At the appearance of the second rising edge in CLK, the DS1 signal takes on the current voltage level of the input composite signal DIN (a LOW voltage level in the case of FIG. 4) and remains at this level until the appearance of the next rising edge in CLK. This process is repeatedly carried out during the appearance and input of the composite signal DIN.

At the appearance of the first falling edge in CLK, the second sampled signal DS2 takes on the current voltage level of the input composite signal DIN (a LOW voltage level in the case of FIG. 4) and remains at this level until the appearance of the next falling edge in CLK. At the appearance of the second falling edge in CLK, the DS2 signal takes on the current voltage level of the input composite signal DIN (a HIGH voltage level in the case of FIG. 4) and remains at this level until the appearance of the next falling edge in CLK. This process is repeatedly carried out during the appearance and input of the composite signal DIN.

Therefore, the low-frequency composite signal DOUT is at a HIGH voltage level only whenever both of DS1 and DS2 are at a HIGH voltage level and at a LOW voltage level whenever both of DS1 and DS2 are a LOW voltage level, and remains unchanged when DS1 and DS2 are not equal in voltage level.

In conclusion, the cutoff frequency of the digital pulse filtering circuit can be preset by simply varying the frequency of the clock signal CLK. When the pulse width of the horizontal/vertical sync signals in the composite signal is changed, the digital pulse filtering circuit is still operable by simply adjusting the frequency of the clock signal CLK correspondingly.

The foregoing preferred embodiment is directed to the scheme of obtaining two sampled signals DS1, DS2 of the input composite signal DIN. When the input composite signal is affected by noise, the sampling points can be increased to obtain n sampled signals including, in addition to DS1 and DS2, a third sampled signal DS3, a fourth sampled signal DS4, and more. This will reduce the possibility of an erroneous output of the low-frequency composite signal DOUT since the chance of the n sampled points being affected by the noise would be very low as n is large.

One advantage of the digital pulse filtering circuit of the invention is that it is completely based on digital circuitry which can be built in integrated circuits. The manufacturing cost is thus very low. Moreover, the cutoff frequency of the digital pulse filtering circuit is dependent only on the frequency of the clock signal, which is very easy and accurate to adjust.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A digital pulse filtering circuit for filtering a composite signal, which comprises:

clock means for generating a periodic clock signal;

a first D-type flip-flop, which is clocked by the clock signal and takes the composite signal as input, for generating a first sampled signal which takes on the current voltage level of the composite signal at the appearance of each rising edge in the clock signal and remains at that voltage level until the appearance of the next rising edge in the clock signal;

a second D-type flip-flop, which is clocked by an inverted version of the clock signal and takes the composite signal as input, for generating a second sampled signal which takes on the current voltage level of the composite signal at the appearance of each falling edge in the clock signal and remains at that voltage level until the appearance of the next falling edge in the clock signal;

a detection circuit, receiving the first and second sampled signals as inputs, for generating a filtered version of the composite signal in such a manner that:

when the first and second sampled signals are both at a high voltage level, the output signal from said detection circuit is at a high voltage level;

when the first and second sampled signals are both at a low voltage level, the output signal from said detection circuit is at a low voltage level; and when the first and second sampled signals are unequal in voltage level, the output signal from said detection circuit remains unchanged.

2. The digital pulse filtering circuit of claim 1, further including:

an inverter for inverting the clock signal to obtain said inverted version of the clock signal used to clock said second D-type flip flop.

3. The digital pulse filtering circuit of claim 2, wherein said detection circuit includes:

a NAND gate having a first input receiving the first sampled signal and a second input receiving the second sampled signal;

a first NOR gate, having a first input receiving the first sampled signal and a second input receiving the second sampled signal;

a second NOR gate, having a first input receiving the output of said NAND gate and a second input receiving the output of said detection circuit; and a third NOR gate, having a first input receiving the output of said second NOR gate and a second input receiving the output of said first NOR gate, the output of said third gate being used as the output of said detection circuit.

4. A digital pulse filtering circuit for filtering an input composite signal, which comprises:

a sampling circuit for sampling the input composite signal based on a periodic clock signal having a preset period, so as to generate first and second sampled signals of the composite signal, wherein the first sampled signal takes on the voltage of the composite signal at the appearance of each rising edge in the clock signal and remains at that voltage level until the appearance of the next rising edge in the clock signal, and the second sampled signal takes on the voltage of the composite signal at the appearance of each falling edge in the clock signal remains at that voltage level until the appearance of the next falling edge of the clock signal; and a detection circuit, receiving the sampled signals, for generating an output signal which is a filtered version of the input composite signal in such a manner that, when the sampled signals are equal in logic voltage state, the output of said detection circuit is changed to the present state of these sampled signals, and otherwise, the current state of the input of said detection circuit remains unchanged.

5. The digital pulse filtering circuit of claim 4, wherein said sampling circuit includes:

first flip-flop means, which is driven by the clock signal and takes the composite signal as input, for generating the first sampled signal;

an inverter for inverting the clock signal; and second flip-flop means, which is driven by the inverted clock signal from said inverter and takes the composite signal as input, for generating the second sampled signal.

6. The digital pulse filtering circuit of claim 5, wherein said first flip-flop means is a D-type flip flop.

7. The digital pulse filtering circuit of claim 5, wherein said second flip-flop means is a D-type flip flop.

8. The digital pulse filtering circuit of claim 4, wherein said detection circuit is devised to implement a predefined truth table in such a manner that:

when the first and second sampled signals are both at a high voltage level, the output signal from said detection circuit is at a high voltage level;

when the first and second sampled signals are both at a low voltage level, the output signal from said detection circuit is at a low voltage level; and when the first and second sampled signals are unequal in voltage level, the output signal from said detection circuit remains unchanged.

9. The digital pulse filtering circuit of claim 8, wherein said detection circuit includes:

a NAND gate having a first input receiving the first sampled signal and a second input receiving the second sampled signal;

a first NOR gate, having a first input receiving the first sampled signal and a second input receiving the second sampled signal;

a second NOR gate, having a first input receiving the output of said NAND gate and a second input receiving the output of said detection circuit; and a third NOR gate, having a first input receiving the output of said second NOR gate and a second input receiving the output of said first NOR gate, the output of said third gate being used as the output of said detection circuit.

* * * * *